(12) United States Patent
Seaberg

(10) Patent No.: US 7,843,271 B2
(45) Date of Patent: Nov. 30, 2010

(54) AUDIO AMPLIFIER AND METHODS FOR USE THEREWITH

(75) Inventor: Charles Eric Seaberg, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1283 days.

(21) Appl. No.: 11/389,778

(22) Filed: Mar. 27, 2006

(65) Prior Publication Data

US 2007/0223741 A1    Sep. 27, 2007

(51) Int. Cl.
*H03F 3/04* (2006.01)

(52) U.S. Cl. ....................... 330/296; 330/285

(58) Field of Classification Search ............... 330/285, 330/296
See application file for complete search history.

(56) References Cited

U.S. PATENT DOCUMENTS

| | | | |
|---|---|---|---|
| 7,362,179 B2* | 4/2008 | Liu et al. | 330/296 |
| 7,545,217 B1* | 6/2009 | Reyes | 330/285 |
| 2005/0140457 A1* | 6/2005 | Bellantoni | 340/10.1 |

* cited by examiner

*Primary Examiner*—Khanh V Nguyen
(74) *Attorney, Agent, or Firm*—Gary R. Stanford

(57) ABSTRACT

An audio amplifier includes an output stage for generating an output stage voltage in response to an input signal and an output stage quiescent current. A controlled current source controls the output stage quiescent current in response to a quiescent current signal during a start-up cycle.

13 Claims, 9 Drawing Sheets

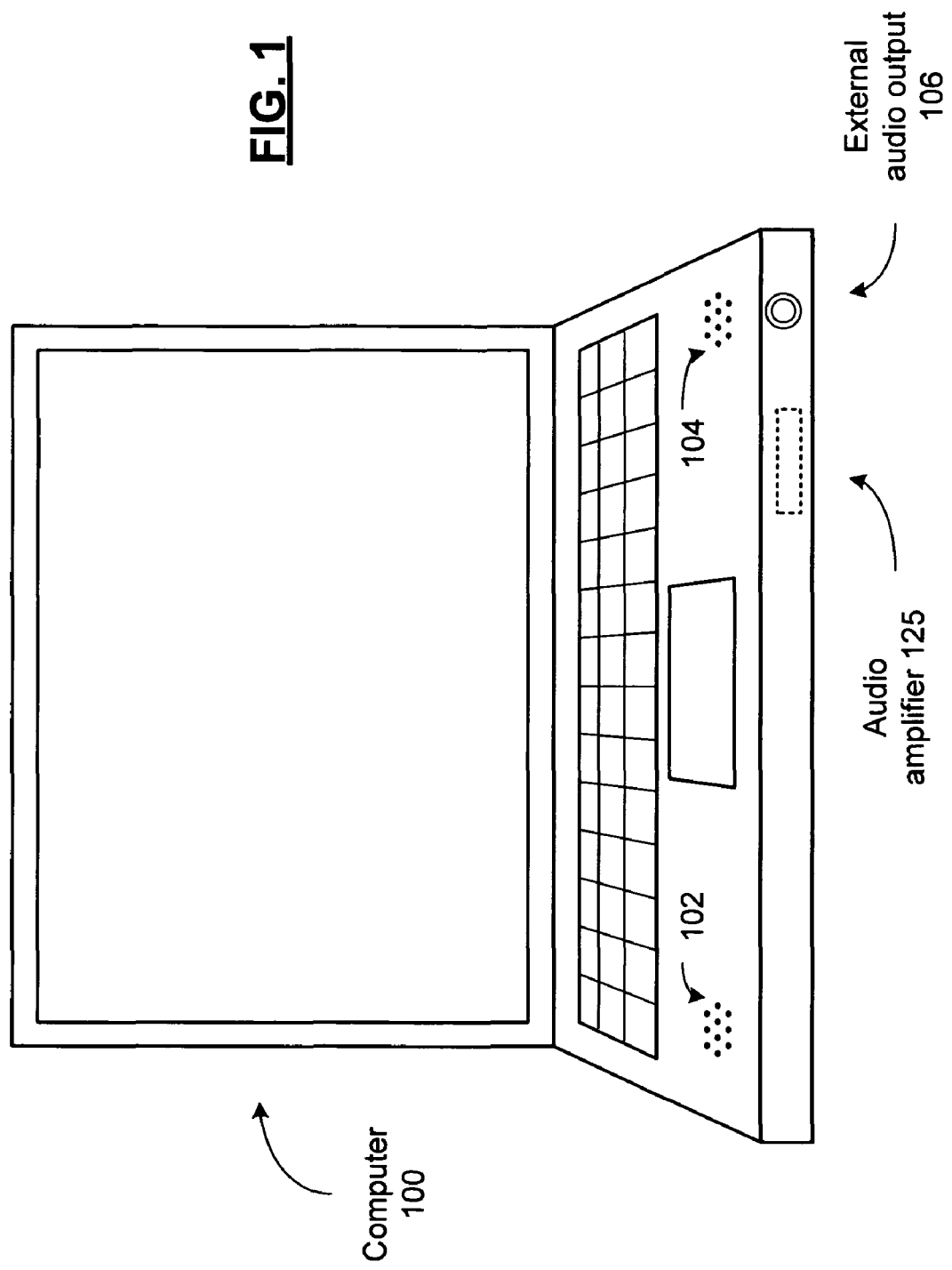

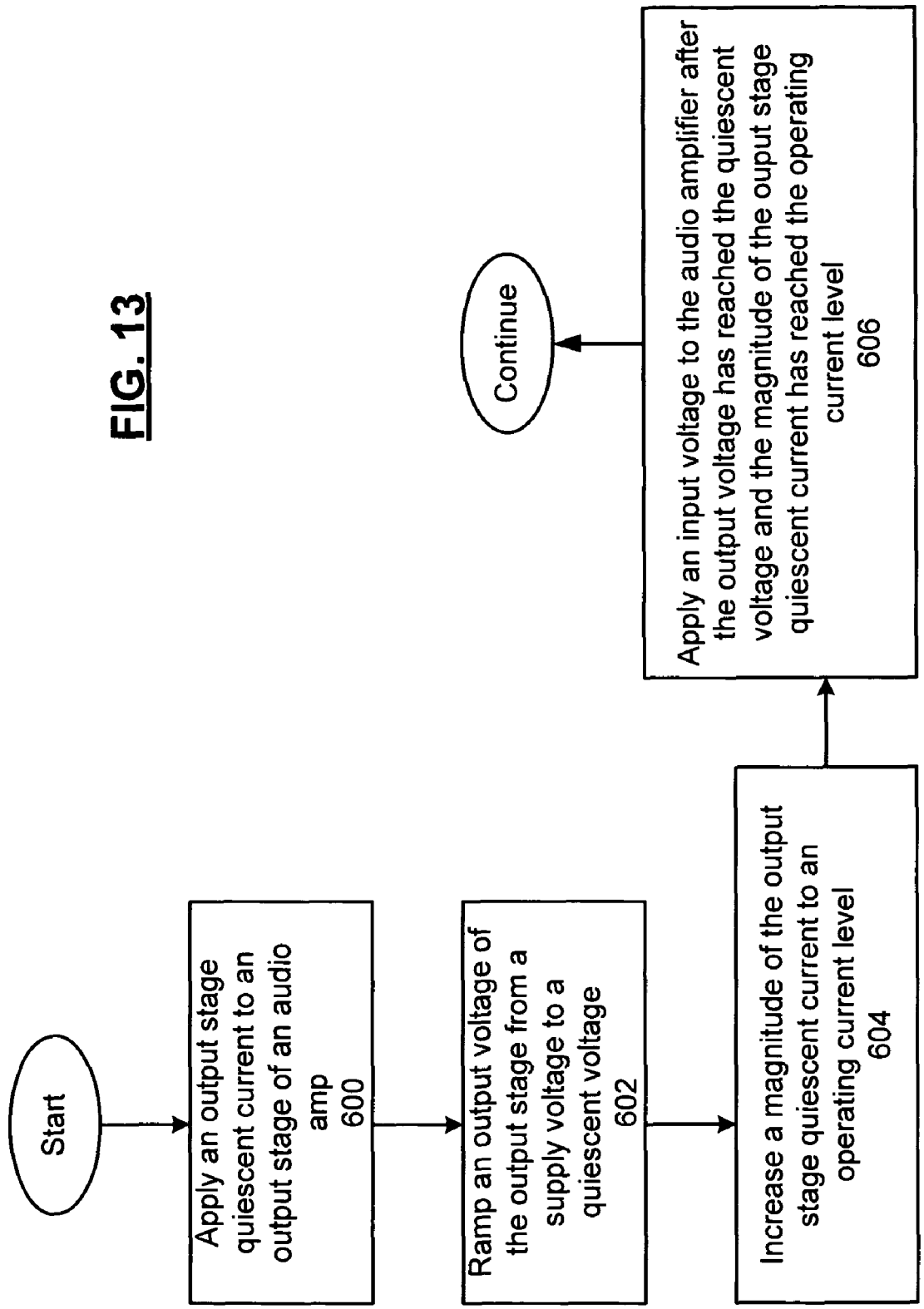

US 7,843,271 B2

AUDIO AMPLIFIER AND METHODS FOR USE THEREWITH

BACKGROUND OF THE INVENTION

1. Technical Field of the Invention

The present invention relates to audio amplifiers and related methods.

2. Description of Related Art

As is known, audio signals are processed by a wide variety of electronic equipment, including portable, or handheld, devices. Such devices include laptop, notebook and other personal computers, personal digital assistants (PDA), CD players, MP3 players, DVD players, AM/FM radio, cellular telephones, etc. Each of these devices includes one or more integrated circuits to provide the functionality of the device. As an example, a computer may include an audio codec integrated circuit to support the processing of audio signals in order to produce an audio output that is delivered to the user through speakers, headphones or the like.

One concern with the implementation of integrated circuits is the noise generated when a device is turned off and turned on. Frequently, a noise transient is generated, such as a "pop", that may be disagreeable to the user or may potentially damage the audio output device. The need exists for audio output circuitry that can reduce the magnitude of these noise transients and that can be efficiently implemented in an integrated circuit.

BRIEF DESCRIPTION OF THE SEVERAL VIEWS OF THE DRAWINGS

FIG. 1 presents a pictorial view of a computer in accordance with an embodiment of the present invention.

FIG. 13 presents a flowchart representation of a method in accordance with the present invention.

Figure 4:
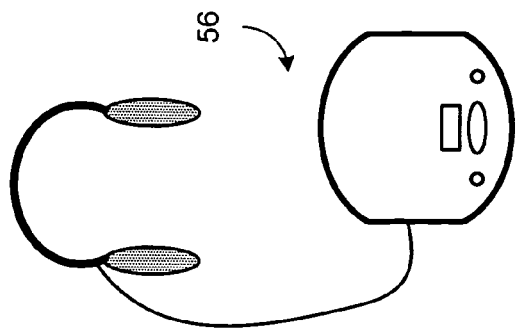
FIGS. 2-5 present pictorial views of various handheld audio devices in accordance with embodiments of the present invention.
Figure 3:
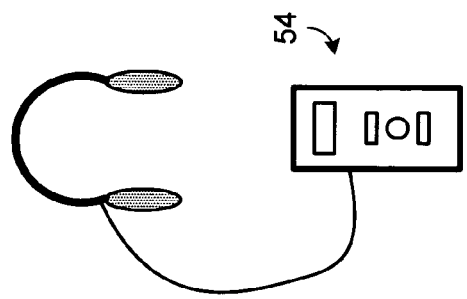
Figure 5:
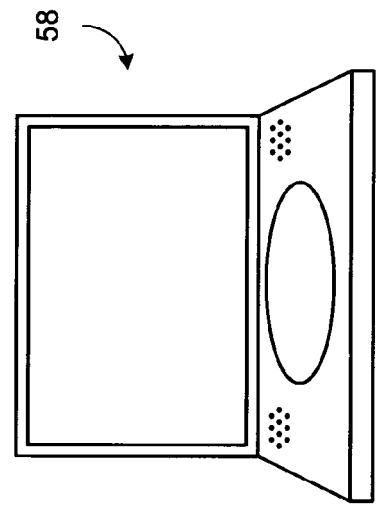
Figure 2:
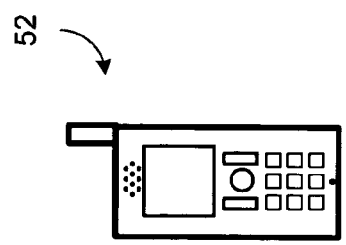

DETAILED DESCRIPTION OF THE INVENTION INCLUDING THE PRESENTLY PREFERRED EMBODIMENTS

FIG. 1 presents a pictorial view of a computer in accordance with an embodiment of the present invention. In particular, computer 100 includes audio amplifier 125 for producing audio signals, such as music, speech signals, audio tracks of movies or other signals, that are stored in memory, on a disk, flash drive or other removable storage medium, or from a streaming source of audio content from an audio codec or other audio processing device. Audio amplifier 125 provides an output signal to integrated speakers 102 and 104. In addition, computer 100 includes an external audio output 106 such as an output jack, for coupling the output signal to external audio output devices such as speakers, stereo systems, headphones, ear buds, or the like.

Audio output driver 125 includes various features and functions in accordance with the present invention that will be described in conjunction with the figures that follow.

FIGS. 2-5 present pictorial views of various handheld audio devices in accordance with embodiments of the present invention. While the audio amplifier 125 has been described in conjunction with its use in a computer such as computer 100, audio amplifier 125 may likewise be incorporated in a cellphone 52, handheld audio device 54 for replaying stored audio files, compact disk player 56 and/or digital video disk play 58 along with other audio devices, and other electronic devices that process audio signals to provide an audio output.

Figure 6:
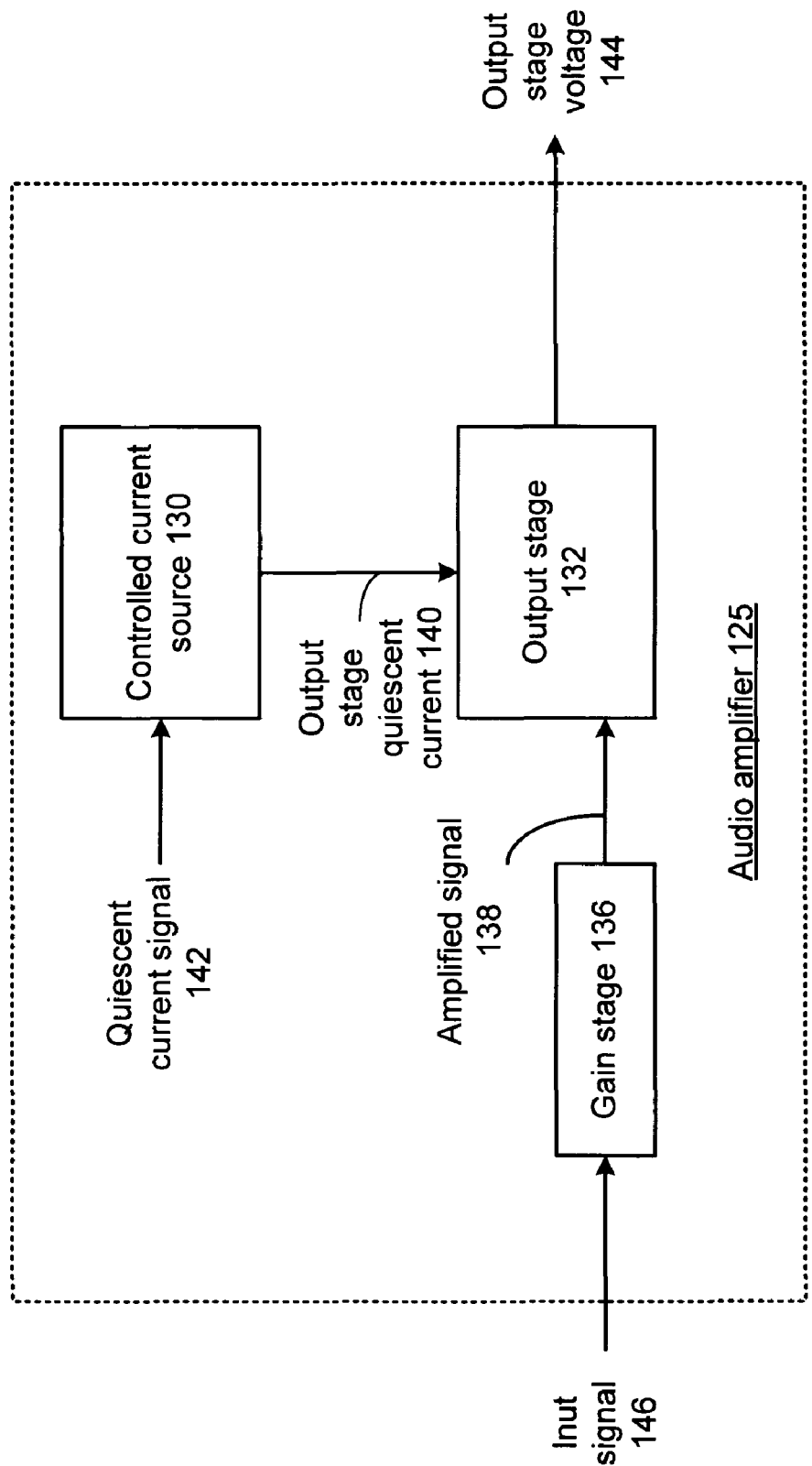
FIG. 6 presents a block diagram representation of an audio amplifier 125 in accordance with an embodiment of the present invention.

FIG. 6 presents a block diagram representation of an audio amplifier 125 in accordance with an embodiment of the present invention. In particular, audio amplifier 125 includes an output stage 132 for generating an output stage voltage 144 in response to an input signal 146, processed by optional gain stage 136 into amplified signal 138 based in an output stage quiescent current 140. A controlled current source 130 is operatively coupled to the output stage 132, for controlling the output stage quiescent current 140 in response to a quiescent current signal 142 that actuates during a start-up cycle. In an embodiment of the present invention, output stage quiescent current 140 is controlled as a variable signal during start-up and then is maintained at a constant or substantially constant level during normal operation, i.e. when audio amplifier 125 is producing an audio output signal in response to input signal 146.

In an embodiment of the present invention, output stage voltage 144 is coupled, such as by alternative current (AC) coupling, to an audio output device such as single speaker that provides an output as a monaural output, or provides an output as one of a plurality of speakers for providing a multi-channel output such as a stereo output, surround sound output, 5.1 or 7.1 channel output, etc. Such an audio output device can include stereo system inputs or speakers having their own amplification that present a high impedance such as 10 kΩ or more. Alternatively, audio output may include one or more loudspeakers, headphones or ear buds having low impedances such as 1 kΩ or as low as a few Ohms. Audio amplifier 125 is capable of supplying sufficient power to drive such audio output device(s) that may be coupled thereto.

In an embodiment of the present invention, output stage 132 can be a class A output stage, class AB output stage or alternative circuit configuration that includes one or more transistors such as field effect transistors, bipolar junction transistors, etc. In an embodiment, the elements of audio amplifier 125 are implemented on one or more integrated circuits and/or that may optionally include one or more discrete components.

The output stage quiescent current 140 is controlled to reduce the magnitude of the transient voltage produced when the audio amplifier 125 is powered up during the start-up cycle. In an embodiment of the present invention, the output stage quiescent current 140 is initially controlled to a small offset current that is gradually increased to an operating current level as the output stage voltage is brought up to a quiescent voltage. It can be appreciated that the initial reduction of the output stage quiescent current reduces the magnitude of any startup transients.

Figure 7:
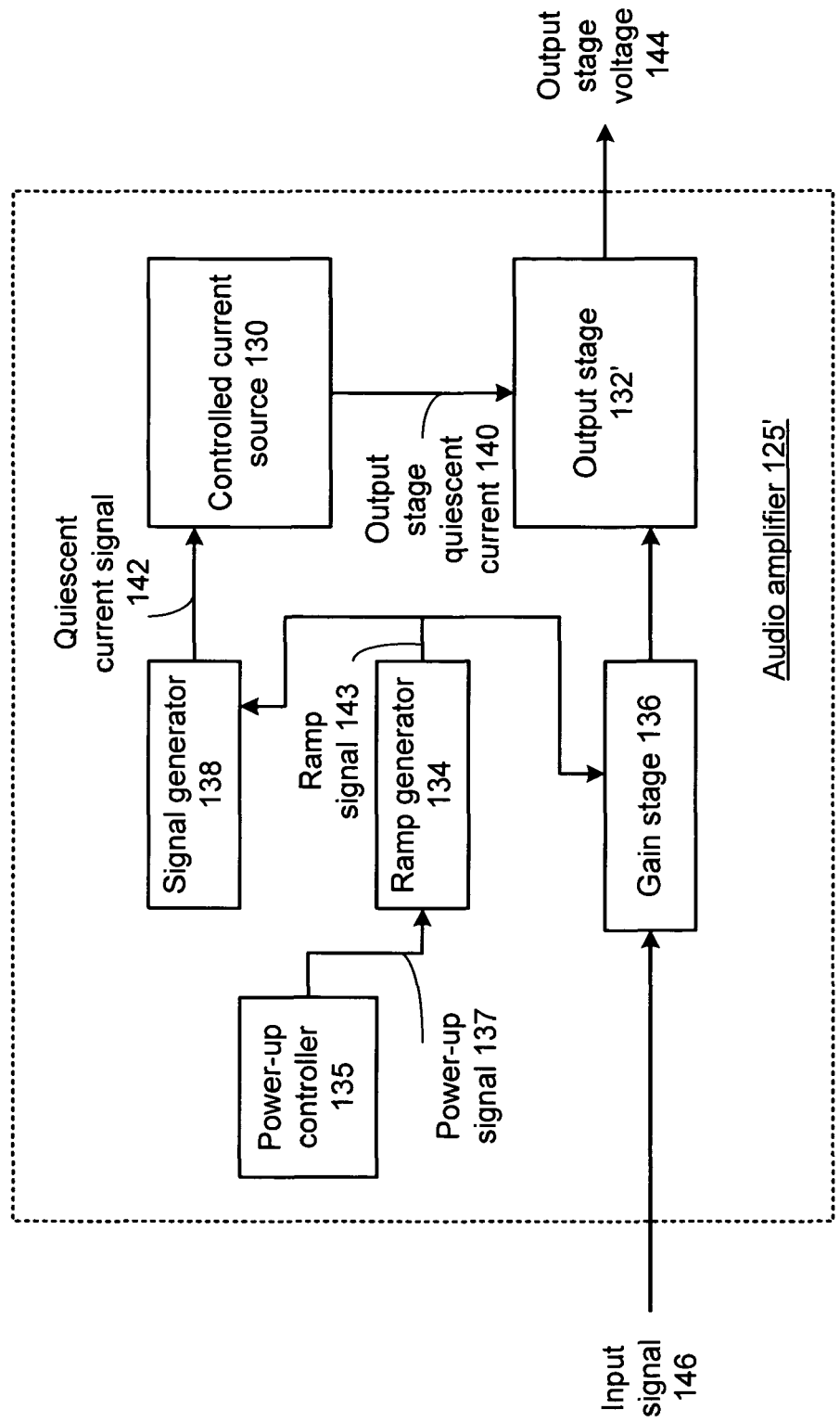
FIG. 7 presents a block diagram representation of an audio amplifier 125' in accordance with an embodiment of the present invention.

FIG. 7 presents a block diagram representation of an audio amplifier 125' in accordance with an embodiment of the present invention. A further embodiment of the present invention is presented that includes many common elements from audio amplifier 125 that are referred to by common reference numerals. Audio amplifier 125' can be used in place of audio amplifier 125 in any of the applications and implementations discussed herein.

Gain stage 136 is included to provide a stage of preamplification for audio amplifier 125'. In this embodiment of the present invention, audio amplifier 125' operates from a positive supply voltage and another supply voltage, such as ground or a negative voltage, etc. During normal operating conditions, output stage voltage 144 operates at a quiescent voltage, such as a voltage that is approximately in the middle of the two supply voltages, to provide a wide voltage swing on the output. Before start-up, the output stage voltage 144 is typically at one of the supply voltages. During a start up cycle of audio amplifier 125', initiated by start-up controller 135 by the generation of start-up signal 137, the output stage voltage 144 must be ramped, either up or down from the supply voltage to the quiescent voltage, prior to applying an input signal 146, to avoid potential clipping. Ramp generator 134 is operatively coupled to gain stage 136 for generating a ramp signal 143 during the start-up cycle. Output stage 132' ramps the output stage voltage 144 from the supply voltage to the quiescent voltage, based on ramp signal 143. The ramp signal 143 is chosen such as to minimize human perception to the startup transient, for instance, by attenuating or eliminating frequencies produced during this output stage that are within the audible frequency range. In addition, ramp voltage 143 has a steady state voltage that produces the quiescent voltage on output stage voltage 144, based on the gains of gain stage 136 and output stage 132'.

In an embodiment of the present invention, ramp generator 134 includes a resistor capacitor (RC) circuit, switched capacitor circuit or other circuit generating a signal of increasing magnitude over time. Start-up controller 135, responds to a power-on of the supply voltages or some other start-up event, and generates start-up signal 137 to trigger the ramp generator 134 to generate ramp signal 143. In an embodiment of the present invention, start-up controller can be implemented with a circuit such as a comparator, pulse generator, monostable multivibrator, state machine or processor.

Signal generator 138 is operatively coupled to ramp generator 134 for generating the quiescent current signal 142 as a function of the ramp signal 143. In an embodiment of the present invention, signal generator 138 produces an initial offset to quiescent current signal 142 so that controlled current source 130 produces an offset current during the start-up cycle when the output stage voltage is the supply voltage such as ground. This can reduce the magnitude of potential transients that occur when output stage 132' is powered up and controlled current source 130 tries to drive the output voltage 144 to ground. After the ramp signal 143 is applied, the controlled current source 130 controls the magnitude of the output stage quiescent current 140 to increase monotonically with an ramping output stage voltage 144 during the start-up cycle. The overall effect is to reduce the magnitude of audio pops and clicks that can occur when audio amplifier 125' is switched on.

Figure 8:
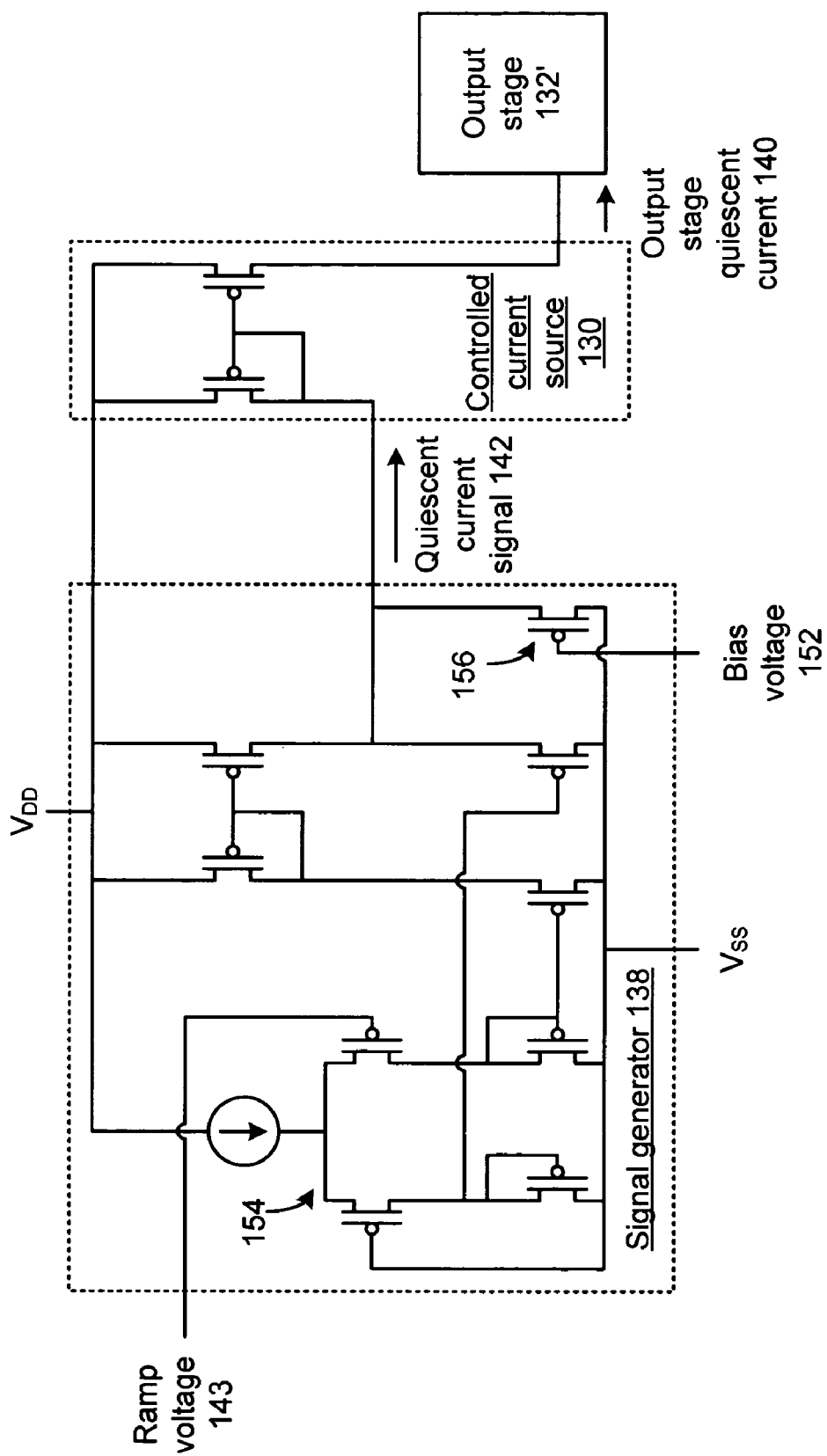
FIG. 8 presents a schematic/block diagram representation of signal generator and controlled current source in accordance with an embodiment of the present invention.

FIG. 8 presents a schematic/block diagram representation of signal generator and controlled current source in accordance with an embodiment of the present invention. An example circuit is presented for implementing signal generator 138 and controlled current source 130, however, as one skilled in the art will recognize when presented the disclosure herein, other circuit implementations are likewise possible within the broad scope of the present invention.

Signal generator 138 and controlled current source 130 are implemented using a plurality of p-channel metal oxide semiconductor (PMOS) transistors that are powered by a drain voltage $V_{DD}$. As shown, controlled current source 130 is implemented with a current mirror circuit that drives output stage quiescent current 140 to mirror quiescent current signal 142. In alternative embodiment, other transistor technologies could likewise be used in the implementation of controlled current source 130 and signal generator 138.

Signal generator 138 is coupled to a source voltage $V_{SS}$, such as a circuit ground or virtual ground. When ramp voltage 143 is ground, the different input circuit 154 produces a negligible output current. In this condition, quiescent current signal 142 is supplied by an offset current generated by transistor 156 in response to bias voltage 152. As ramp voltage 143 increases, the magnitude of quiescent current signal 142 increases up to the operating current level, that is mirrored by controlled current source 130 in producing output stage quiescent current 140.

In an embodiment of the present invention, bias voltage 152 can be generated from a voltage divider from the drain voltage $V_{DD}$. However, other implementations are possible including the generation of the bias voltage 152 via a voltage regulator, direct current to direct current (DC-DC) converter, a diode connected transistor or other source.

Figure 9:
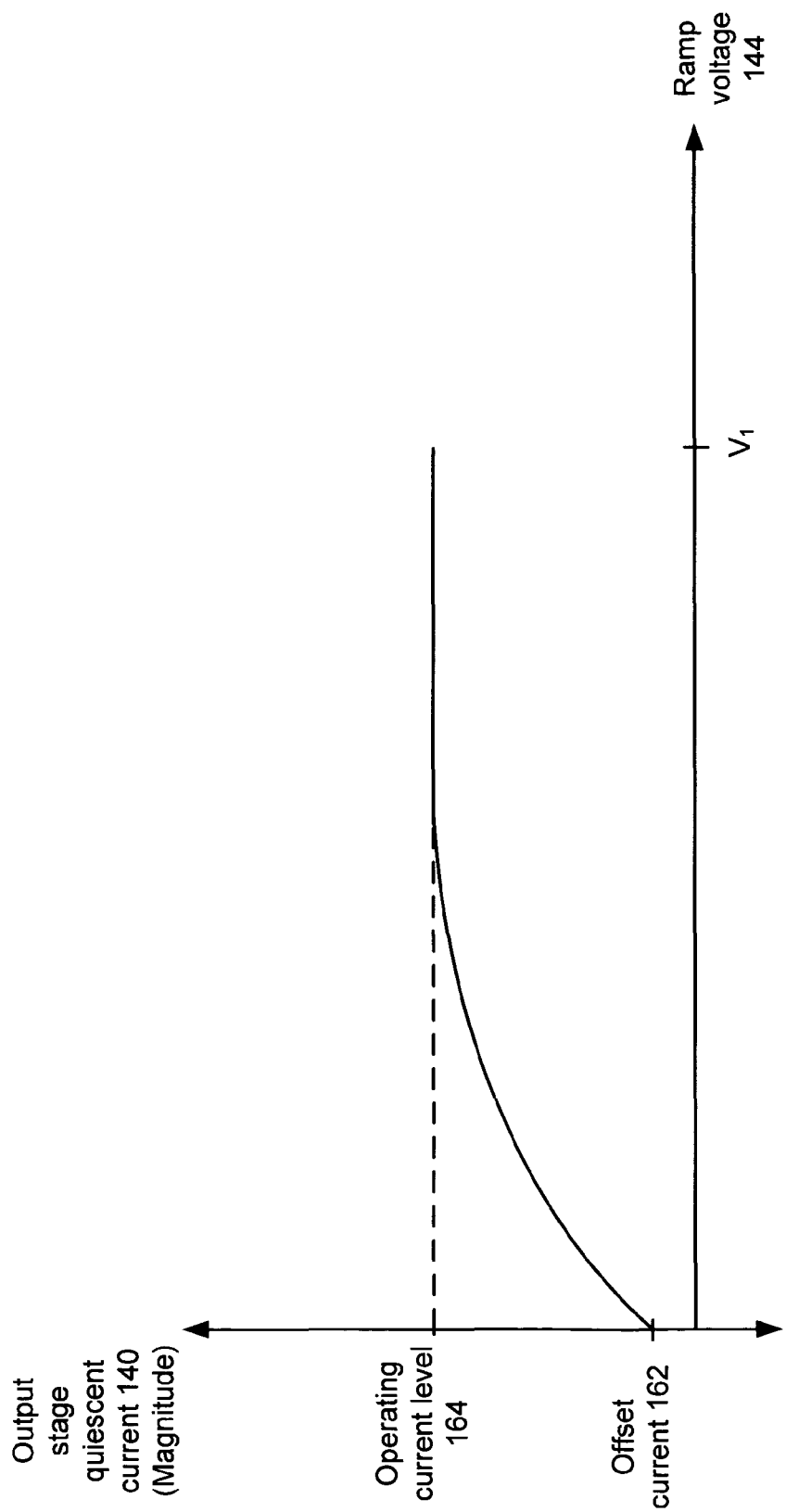
FIG. 9 presents a graphical representation of a transfer function in accordance with an embodiment of the present invention.

FIG. 9 presents a graphical representation of a transfer function in accordance with an embodiment of the present invention. An example transfer function is presented for signal generator 138 and controlled current source 130 that expresses a relationship between ramp signal 143 and the magnitude of output stage quiescent current 140. In particular, when the ramp signal 143 is at the supply voltage such as ground, the magnitude of the output stage quiescent current 140 is controlled to an offset current 162. As the ramp signal 143 is increased during a start-up cycle of audio amplifier 125', the magnitude of the output stage quiescent current 140 is controlled to increase nonlinearly and monotonically to reach the operating current level 164. In the embodiment of the present invention illustrated in FIG. 9, the operating current level 164 is reached, substantially before the steady state voltage $V_1$ is reached.

While a particular non-linear function is shown, other functions including linear functions and piecewise linear functions can likewise be implemented within the broad scope of the present invention.

Figure 10:
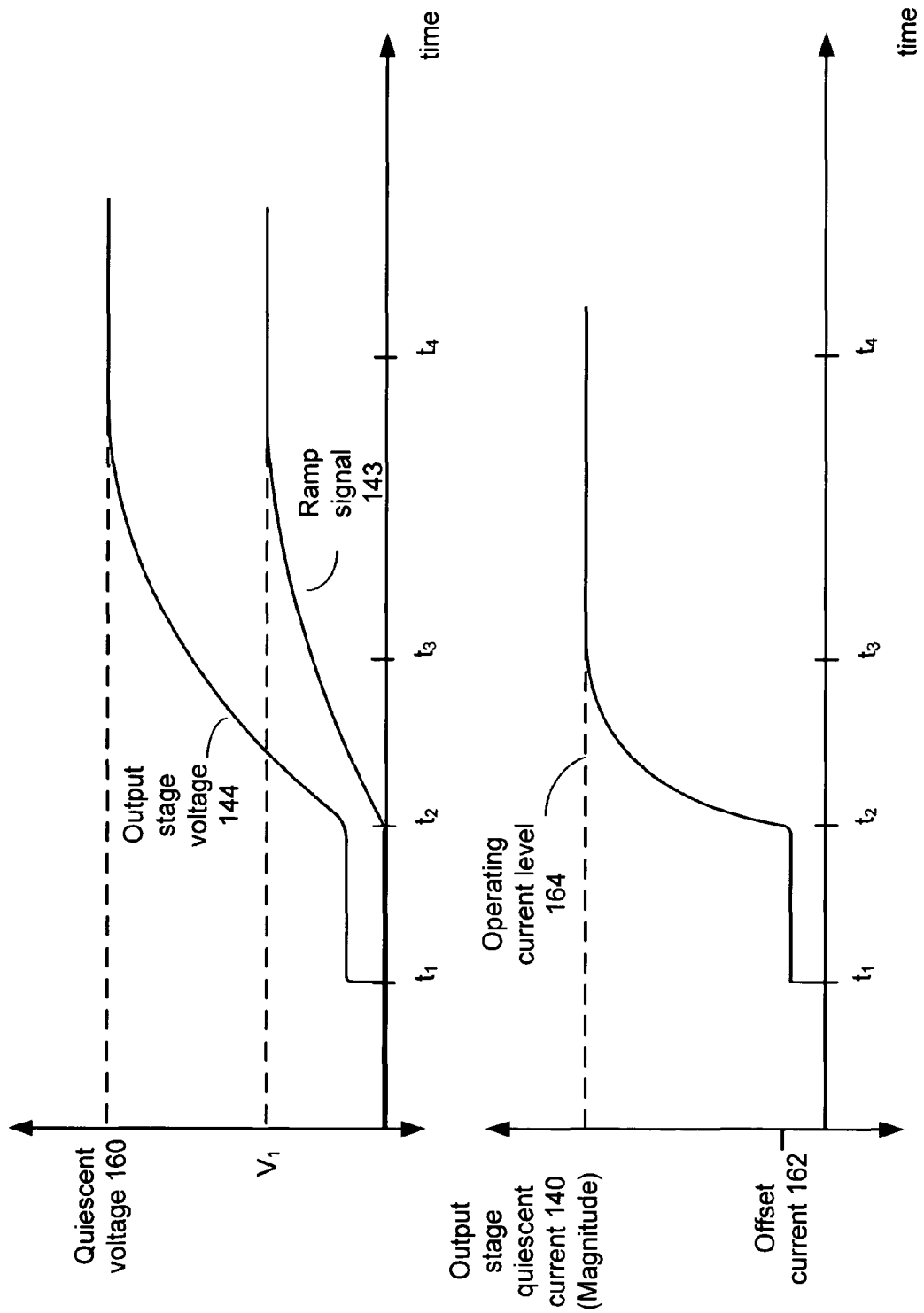
FIG. 10 presents a graphical representation of a signal diagram in accordance with an embodiment of the present invention.

FIG. 10 presents a graphical representation of a signal diagram in accordance with an embodiment of the present invention. In particular, a possible progression of the output stage voltage 144, and output stage quiescent current 142 are shown. As audio amplifier 125 and/or 125' is started up in response to power being applied or switched on, start-up signal 137 or some other start-up event, the controlled current source 130 applies an output stage quiescent current 140 at time $t_1$, that begins at the offset current 162. This produces a small offset voltage in output stage voltage 144. At time $t_2$, ramp voltage 143 is applied and the magnitude of the output stage quiescent current increases until operating current level is reached at time $t_3$. At time $t_4$, ramp signal 143 reaches steady state voltage $V_1$ and the output stage voltage 144 reaches its quiescent voltage 160. The audio amplifier 125 and or 125' is ready to accept an input signal 146 and the start-up cycle is complete.

Figure 11:
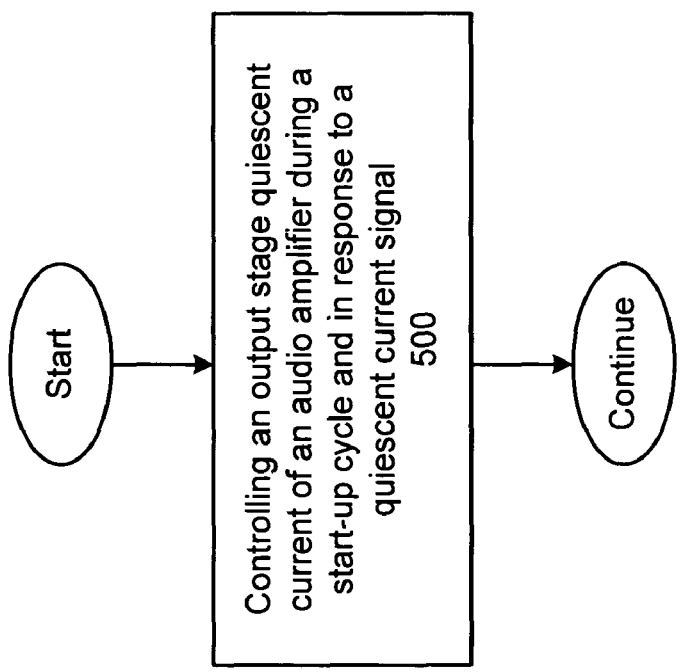
FIG. 11 presents a flowchart representation of a method in accordance with the present invention.

FIG. 11 presents a flowchart representation of a method in accordance with the present invention. In particular, a method is presented for use in conjunction with one or more features described in association with FIGS. 1-10. In step 500, an output stage quiescent current of an audio amplifier is controlled during a start-up cycle and in response to a quiescent current signal.

Figure 12:
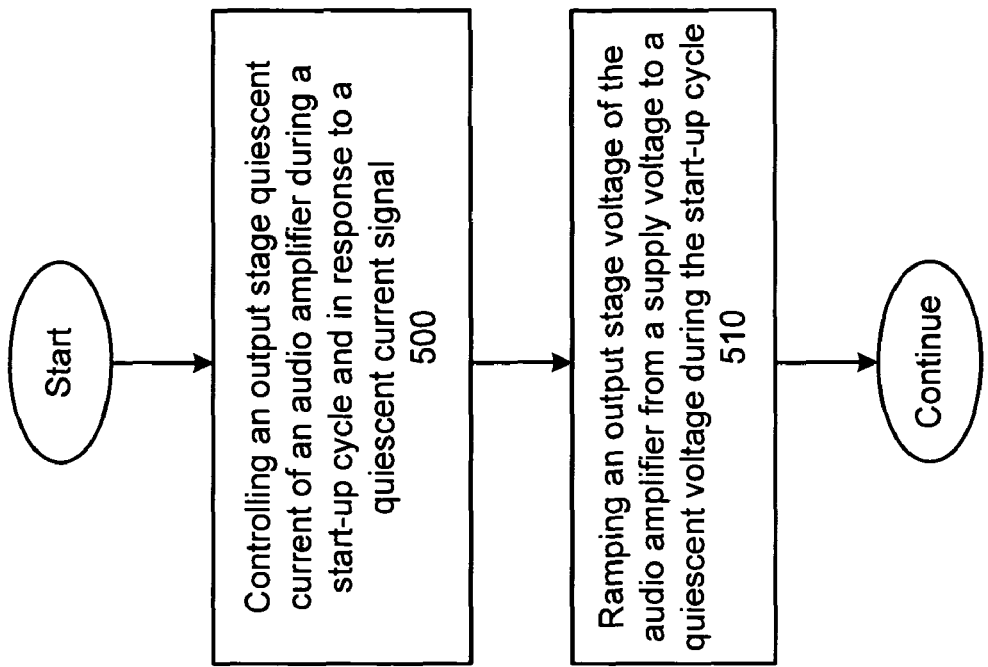
FIG. 12 presents a flowchart representation of a method in accordance with the present invention.

FIG. 12 presents a flowchart representation of a method in accordance with the present invention. A method is presented for use in conjunction with one or more features described in association with FIGS. 1-11. In particular, a method is presented that includes step 500 from FIG. 10. In addition, an output stage voltage of the audio amplifier is ramped from a supply voltage to a quiescent voltage during the start-up cycle, as shown in step 510.

In an embodiment of the present invention, step 500 includes controlling the output stage quiescent current to an offset current during the start-up cycle when the output stage voltage is ground. In addition, the quiescent current signal is a function, such as a nonlinear function, of the output stage voltage during the start-up cycle. Further, the output stage quiescent current signal has a magnitude that increases monotonically with ramping output stage voltage during the start-up cycle.

FIG. 13 presents a flowchart representation of a method in accordance with the present invention. A method is presented for use in conjunction with one or more features described in association with FIGS. 1-12. In step 600, an output stage quiescent current is applied to an output stage of the audio amplifier. In step 602, an output voltage of the output stage is increased from ground to a quiescent voltage. In step 604, the magnitude of the output stage quiescent current is increased to an operating current level. In step 606, an input voltage is applied to the audio amplifier after the output voltage has reached the quiescent voltage and the magnitude of the output stage quiescent current has reached the operating current level.

In an embodiment of the present invention, steps 602 and 604 happen concurrently. Step 604 includes controlling the magnitude of the output stage quiescent current as a function of the output stage voltage. Further, the magnitude of the output stage quiescent current is controlled to be a non-linear, monotonically increasing function of the output stage voltage. The increase in magnitude of the output current is controlled to occur in a predetermined relationship to the increase of the quiescent output voltage in time.

The various functional modules disclosed herein, while described as circuits, can be implemented using hardware or using a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions that are stored in memory. The memory may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. Further note that, the memory stores, and the processing module executes, operational instructions corresponding to at least some of the steps and/or functions illustrated herein.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to order of magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled". As one of ordinary skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

In preferred embodiments, the various circuit components are implemented using 0.35 micron or smaller CMOS technology. Provided however that other circuit technologies including other transistor, diode and resistive logic, both integrated or non-integrated, may be used within the broad scope of the present invention. Likewise, various embodiments described herein can also be implemented as software programs running on a computer processor. It should also be noted that the software implementations of the present invention can be stored on a tangible storage medium such as a magnetic or optical disk, read-only memory or random access memory and also be produced as an article of manufacture.

Thus, there has been described herein an apparatus and method, as well as several embodiments including a preferred embodiment, for implementing an audio amplifier that can be implemented on an integrated circuit such as a system on a chip integrated circuit. Various embodiments of the present invention herein-described have features that distinguish the present invention from the prior art.

It will be apparent to those skilled in the art that the disclosed invention may be modified in numerous ways and may assume many embodiments other than the preferred forms specifically set out and described above. Accordingly, it is intended by the appended claims to cover all modifications of the invention which fall within the true spirit and scope of the invention.

What is claimed is:

1. An audio amplifier comprising:
an output stage for generating an output stage voltage in response to an input signal and an output stage quiescent current;

a controlled current source, operatively coupled to the output stage, for controlling the output stage quiescent current in response to a quiescent current signal during a start-up cycle;

a ramp generator, operatively coupled to the output stage, for generating a ramp signal during the start-up cycle;

wherein the output stage, based on the ramp signal, ramps the output stage voltage from a supply voltage to a quiescent voltage; and a signal operatively coupled to the ramp generator, for generating the quiescent current signal as a function of the ramp signal.

2. The audio amplifier of claim 1 wherein the quiescent current signal is a nonlinear function of the ramp signal.

3. An audio amplifier comprising:

an output stage for generating an output stage voltage in response to an input signal and an output stage quiescent current;

a controlled current source, operatively coupled to the output stage, for controlling the output stage quiescent current in response to a quiescent current signal during a start-up cycle; and wherein the output stage quiescent current has a magnitude and the output stage voltage ramps during the start-up cycle and wherein the controlled current source controls the magnitude of the output stage quiescent current to increase monotonically with the ramping of the output stage voltage during the start-up cycle.

4. The audio amplifier of claim 1 wherein the controlled current source produces an offset current during the start-up cycle when the output stage voltage is ground.

5. The audio amplifier of claim 1 wherein the controlled current source includes a current mirror circuit.

6. The audio amplifier of claim 1 wherein the output stage and the controlled current source are implemented on an integrated circuit.

7. An method comprising:

controlling an output stage quiescent current of an audio amplifier during a start-up cycle and in response to a quiescent current signal;

ramping an output stage voltage of the audio amplifier from a supply voltage to a quiescent voltage during the start-up cycle; and wherein the quiescent current signal is a function of the output stage voltage during the start-up cycle.

8. The method of claim 7 wherein the step of controlling the output stage quiescent current includes controlling the output stage quiescent current to an offset current during the start-up cycle when the output stage voltage is the supply voltage.

9. The method of claim 7 wherein the quiescent current signal is a nonlinear function of the output stage voltage during the start-up cycle.

10. The method of claim 7 wherein the output stage quiescent current signal has a magnitude that increases monotonically with ramping output stage voltage during the start-up cycle.

11. An method for starting an audio amplifier comprising:

applying an output stage quiescent current to an output stage of the audio amplifier;

ramping an output voltage of the output stage from a supply voltage to a quiescent voltage;

increasing a magnitude of the output stage quiescent current to an operating current level;

applying an input voltage to the audio amplifier after the output voltage has reached the quiescent voltage and the magnitude of the output stage quiescent current has reached the operating current level; and wherein the step of increasing the magnitude of the output stage quiescent current includes controlling the magnitude of the output stage quiescent current as a function of the output stage voltage.

12. The method of claim 11 wherein the step of increasing the magnitude of the output stage quiescent current includes controlling the magnitude of the output stage quiescent current as a non-linear function of the output stage voltage.

13. The method of claim 11 wherein the step of increasing the magnitude of the output stage quiescent current includes increasing the magnitude of the output stage quiescent current monotonically with ramping output stage voltage.

* * * * *